United States Patent [19]

Gal

[11] Patent Number: 4,697,139
[45] Date of Patent: Sep. 29, 1987

[54] LOGIC CIRCUIT HAVING TESTABILITY FOR DEFECTIVE VIA CONTACTS

[75] Inventor: Laszlo V. Gal, Poway, Calif.

[73] Assignee: Unisys Corporation, Detroit, Mich.

[21] Appl. No.: 11,368

[22] Filed: Feb. 2, 1987

Related U.S. Application Data

[63] Continuation of Ser. No. 705,192, Feb. 25, 1985, abandoned.

[51] Int. Cl.[4] ............................................. G01R 31/28
[52] U.S. Cl. ................................ 324/73 R; 324/158 R
[58] Field of Search ........... 324/73 R, 73 PC, 73 AT, 324/158 R; 371/15, 25

[56] References Cited

U.S. PATENT DOCUMENTS 4,499,579 2/1985 Still et al. ......................... 324/73 R Primary Examiner—Ernest F. Karlsen
Attorney, Agent, or Firm—Charles J. Fassbender; L. Joseph Marhoefer

[57] ABSTRACT

An integrated circuit having improved testability for defects includes a group of logic gates having respective input terminals and output terminals; a conductor that intercouples the output terminal of one logic gate in the group to respective input terminals on the remaining logic gates; a first via contact which, in the absence of a defect, couples the conductor through a first resistive device to a low voltage bus; a parasitic capacitor which couples the conductor to a high voltage bus; and a second via contact which, in the absence of a defect, couples the conductor through a second resistive device to the high voltage bus.

11 Claims, 7 Drawing Figures

FIG. 3.

eg.1 ~ $\text{abs}\left[\begin{array}{c}\text{VOLTAGE COUPLED TO}\\ \text{CONDUCTOR 20 BY } R_{up}\end{array}\right] < \text{abs}\left[\dfrac{\text{LOGIC 1} + \text{LOGIC 0}}{2}\right]$ eg.2 ~ $\text{abs}[I_b(N-1)R_{up}] < \text{abs}[V_r]$ eg.3 ~ $R_{up} < \text{abs}\left[\dfrac{V_r}{I_b(N-1)}\right]$ eg.4 ~ $I_b = 5\mu a$, $N-1 = 10$, $V_r = 1.3$; $R_{up} < 26K\Omega$

FIG. 4.

eg.1 ~ CAP DELAY = $t_c = \dfrac{VC_p}{I_c}$ eg.2 ~ WITHOUT $R_{up}$, AVERAGE $I_c \simeq \dfrac{5 - V_r}{R_{DN}}$ eg.3 ~ WITH $R_{up}$, AVERAGE $I_c \simeq \dfrac{5 - V_r}{R_{DN}} - \dfrac{V_r}{R_{up}}$ eg.4 ~ $R_{up} > 4R_{DN}$ eg.5 ~ $\dfrac{5 - V_r}{R_{DN}} = \dfrac{5 - 1.3}{3K\Omega} = 1.2\,ma$ ~ $\dfrac{V_r}{R_{up}} = \dfrac{1.3}{20K\Omega} = 0.065\,ma$ eg.6 ~ $t_c$ WITH $R_{up} \simeq 1.05\, t_c$ WITHOUT $R_{up}$.

eg.7 ~ IF GATE DELAY $\approx t_c$,

THEN TOTAL DELAY INCREASE $\approx 2.5\%$

FIG.5.
eg.1 ~ PROBABILITY OF DEFECTIVE VIA = $P_d$
eg.2 ~ PROBABILITY OF MISSING $R_{DN}$ = $P_d$
eg.3 ~ PROBABILITY OF MISSING $R_{up}$ = $P_d$
eg.4 ~ PROBABILITY OF MISSING $R_{up}$ AND $R_{DN}$ ONE SAME CONDUCTOR $\} = (P_d)^2$
eg.5 ~ PROBABILITY OF MISSING $R_{DN}$ BEING UNDETECTABLE ANYWHERE ON CHIP $\} = (P_d)^2 N_g$
eg.6 ~ $P_d = 10^{-6}$, $N_g = 10^3$; $(P_d)^2 N_g = 10^{-9}$; $P_d N_g = 10^{-3}$
FIG.6A.
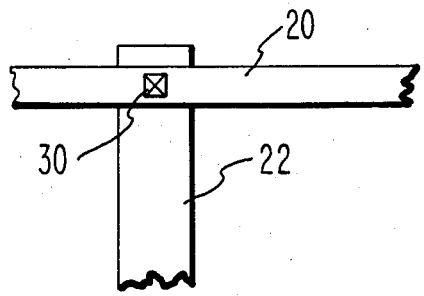
FIG.6B.
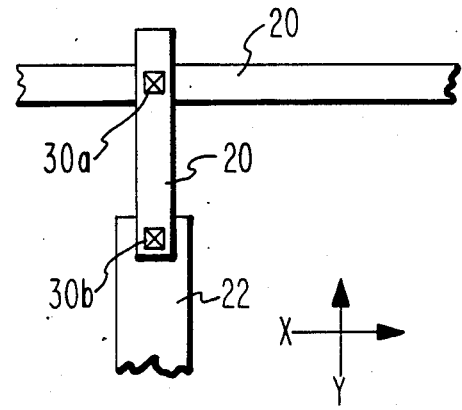

LOGIC CIRCUIT HAVING TESTABILITY FOR DEFECTIVE VIA CONTACTS

This is a continuation of application Ser. No. 705,192, filed Feb. 25, 1985 and now abandoned.

BACKGROUND OF THE INVENTION

This invention relates to integrated logic circuits; and in particular, it relates to structures for such circuits which improve their testability for defective via contacts.

Basically, an integrated logic circuit is a combination of hundreds or thousands of logic gates which are integrated on a single semiconductor chip. These gates are interconnected on the chip to perform various logic functions by conductors that are formed by one or more patterned metal layers.

The conductors are separated from the gates and separated from each other by insulating layers. Connections between the conductors and the gates are made by via contacts which penetrate through the insulating layers.

After the fabrication of the integrated logic circuit is complete, the chip is usually tested by applying a set of logic signals to the input terminals of the chip and examining the state of the output signals that are generated. This test typically is repeated hundreds of times with different combinations of input signals. However, regardless of how many different combinations of input signals are used, certain types of defects in the chip still are not detected.

In particular, the above described test does not detect whether or not the chip is operating at the correct speed. To check the speed of a circuit, the delay between the application of the input signals to the chip's input terminals and the generation of the output signals on the chip's output terminals must be measured. Simply checking that the output signals are in their correct state does not check speed.

However, a typical chip may have over one hundred terminals, and the delay through the chip for each of those terminals will be different depending upon the connections within the chip. Thus, to test the spped at which signals propagate from all the input terminals to all the output terminals under all combinations of input signals is not practicable.

Further, discrete wiring must be used to connect the input and output terminals of a chip to any tester, and such wiring can cause reflections and ringing to occur on the input and output signals. Consequently, even if the delay of all the output signals were separately measured for all combinations of input signals, the ringing and reflections caused by the discrete wiring would add to the delay and give a false indication of a defect.

One way in which a logic gate's speed can be adversely slowed down by a fabrication defect is with a defective via contact. This is especially true where the logic gate is of the type which has an output transistor that turns on and off depending upon whether or not the gate is in a logical one or a logical zero state, and has a pulldown resistor that is coupled to the output terminal through a via contact.

If the via contact is defective, the pulldown resistor is not connected to the output terminal. Then, when the output transistor turns off, the voltage on the output terminal does not quickly drop to the zero level; but instead, it slowly ramps down to a zero.

This type of defect is not detected by simply examining the state of the chip's output signals without measuring their speed. However, such a defect is intolerable in a system environment in which signal speed is critical.

Accordingly, a primary object of the invention is to provide an integrated logic circuit having improved testability for defective via contacts.

BRIEF SUMMARY OF THE INVENTION

This object, and others, are achieved in one embodiment of the invention by an integrated circuit comprising a plurality of logic gates having respective input terminals and output terminals. The gates are arranged in multiple groups such that, in each group, a conductor intercouples an output terminal of one logic gate to respective input terminals on the remaining gates. The conductor in each group is coupled through a parasitic capacitor to a high voltage bus; and, in the absence of a defect, is coupled through a first via contact and a first resistive component to a low voltage bus. Also in each group, the conductor is coupled, in the absence of a defect, through a second via contact and a second resistive component to a high voltage bus.

BRIEF DESCRIPTION OF THE DRAWINGS

Various features and advantages of the invention are described in the Detailed Description in conjunction with the accompanying drawings wherein:

FIG. 3 is a set of equations which place a constraint on the pullup resistor in the FIG. 1 circuit;

FIG. 4 is a set of equations which place another constraint on the pullup resistor in the FIG. 1 circuit;

FIG. 5 is a set of equations which show how the FIG. 1 circuit substantially decreases the probability of a missing pulldown resistor being undetectable; and FIGS. 6A and 6B illustrate structural details of the via contacts in the FIG. 1 circuit.

DETAILED DESCRIPTION OF THE INVENTION

Figure 1:
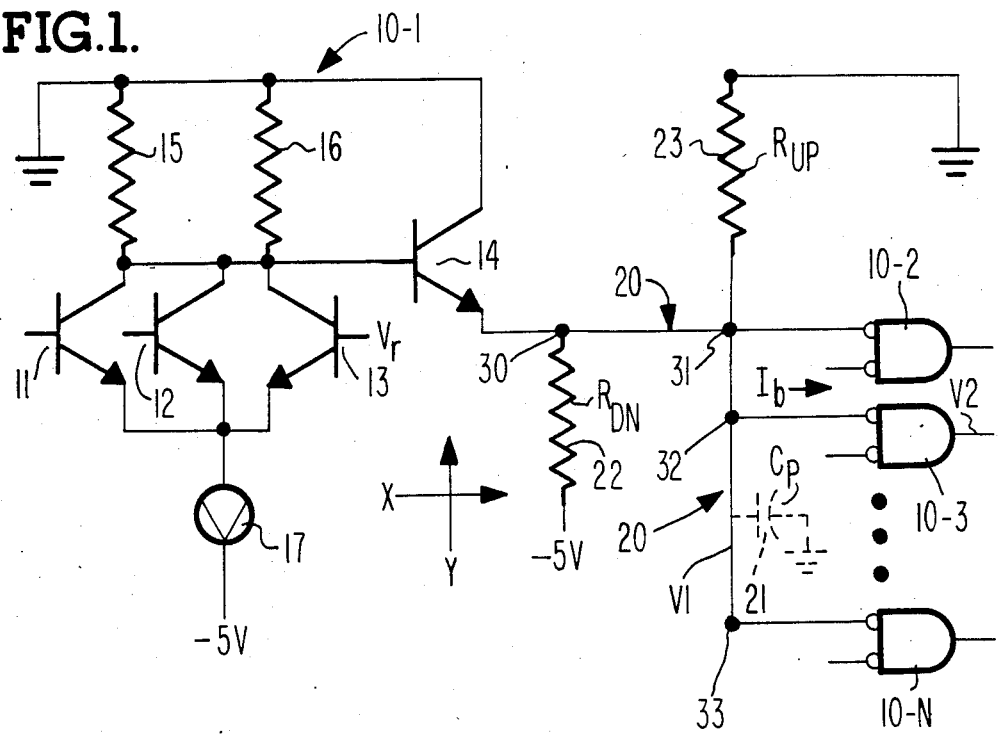
FIG. 1 is a detailed circuit diagram of one preferred embodiment of the invention.

Referring now to FIG. 1, a preferred embodiment of the invention will be described. This embodiment includes a group of logic gates 10-1, 10-2, ... 10-N. All of the gates have the same internal construction, and so for the sake of simplicity, only gate 10-1 is shown in detail.

Gate 10-1 includes four transistors 11, 12, 13, and 14; three resistors 15 and 16; and a current source 17. These components 11 thru 17 are interconnected as illustrated. Input terminals to the gate are the base of transistors 11 and 12; and an output terminal is the emitter of transistor 14.

When at least one signal on the input terminals is a logical one, then the current to source 17 flows through resistor 15. This turns transistor 14 off and places the gate in a xero state. Conversely, if the signals on both of the input terminals are a logical zero, then the current to source 17 flows through resistor 16. This turns on transistor 14 and places the gate in a one state.

A conductor 20 couples the output temrinal of gate 10-1 to respective input terminals on the remaining gages 10-2 thru 10-N. Conductor 20 has a parasitic capacitance 21. A pulldown resistor 22 couples conductor 20 to a low voltage bus; and a pullup resistor 23 couples conductor 20 a high voltage bus.

All of the above described components are fabricated on a single semiconductor chip. That chip may also contain many other logic gates of any type which are interconnected in groups by respective conductors 20 as described above. Preferably, the chip contains at least 500 gates, and the number of gates per group is between two and twenty.

Components 11 thru 17, 22, and 23 plus all connections internal to the gates may be constructed on the chip before conductor 20 is made. In that event, the gates and pullup and pulldown resistors are formed by a set of masks whose patterns are fixed. Subsequently, conductor 20 which interconnects the gates is fabricated by another set of masks which are not fixed but are customized according to any desired interconnection pattern.

Preferably, the interconnecting conductor 20 is formed by two patterned layers of metal. One of the layers forms all of the portions of conductor 20 which lie in the X direction, whereas the other layer forms the remaining portions of conductor 20 which lie in the Y direction.

These two layers of metal which form conductor 20 overlie one another and are separated by an insulating layer. Connections are made between the conductor layers by a via contact which penetrates the insulating layer.

For example, reference numeral 30 indicates where a via contact connects pulldown resistor 22 to conductor 20. Similarly, reference numerals 31, 32, and 33 show the location along conductor 20 where other via contacts occur.

Figure 2:
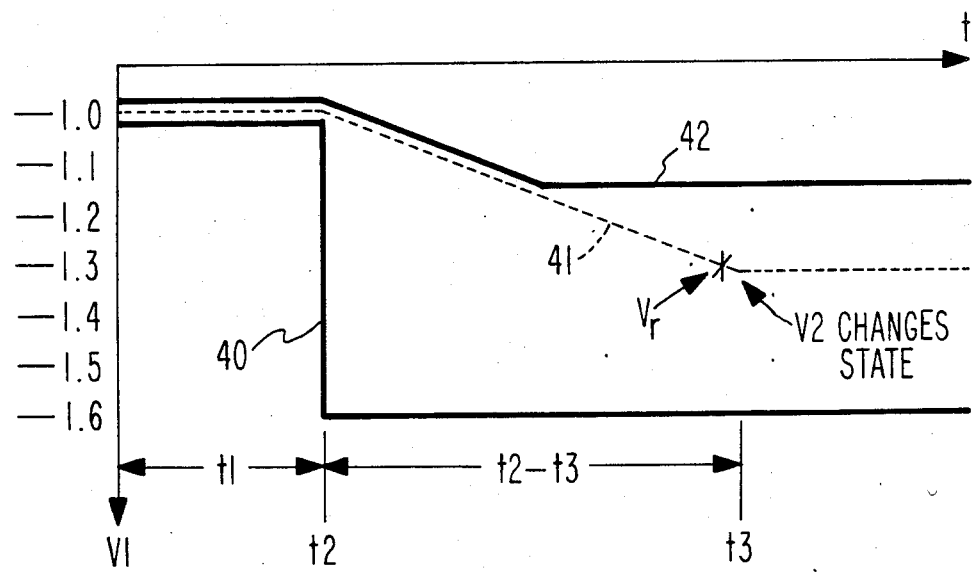
FIG. 2 is a set of curves which illustrate the operation of the FIG. 1 circuit.

Referance should now be made to FIG. 2 wherein a set of waveforms 40, 41, and 42 illustrate that the above circuit has an improved testability. In these curves, the voltage $V_1$ on conductor 20 is plotted on the vertical axis and time is plotted on the horizontal axis.

Waveform 40 shows how voltage $V_1$ varies under the condition where all of the via contacts 30-33 are present. By comparison, waveform 41 shows voltage $V_1$ under the condition where via contact 30 is defective and pullup resistor 23 is deleted from the circuit. Then waveform 42 shows how voltage $V_1$ varies under the condition where via contact 30 is defective and pullup resistor 23 is present.

Consider first waveform 40. During time $t_1$, transistor 14 is on and so a high voltage is coupled onto conductor 20. Then at time $t_2$, transistor 14 turns off and thus the pulldown resistor 22 rapidly couples a low voltage onto conductor 20.

However, if the via contact 30 is defective, then the pulldown resistor 22 cannot couple the low voltage to conductor 20. Instead, the voltage $V_1$ on conductor 20 drops slowly due to a current which passes through the parasitic capacitor 21 and into the input terminals of logic gates 10-2 thru 10-N.

If the pullup resistor 23 is not present, the voltage $V_1$ on conductor 20 drops as illustrated by curve 41 until it reaches the reference voltage $V_r$. This is shown in FIG. 2 as occurring at time $t_3$. When that occurs, the logic gates which receive voltage $V_1$ interpret it as a logical zero and thus can change state.

After the logic gates 10-2 thru 10-N change state, it is impossible to determine from their output signal that the via contact 30 is defective. Thus, in order to detect the defective via contact 30, the output state of the logic gates 10-2 thru 10-N must be tested during the time interval $t_2$-$t_3$. However, that time interval is too short to be caught with a tester.

Mathematically, the timer interval $t_2$-$t_3$ can be expressed as $VC_P \div (N-1)I_b$. In this expression, V is the voltage change that occurs in capacitor 21 during the time interval $t_2$-$t_3$, $C_p$ is the capacitance of capacitor 21, $N-1$ is the number of gates which have an input terminal coupled to conductor 20, and $I_b$ is the current which passes into the input terminal of one gate.

As a practical numerical example, consider the case where V is 0.3 volts, $C_p$ is in the range of 0.25 picofarads to 25 picofarads, $N-1$ is 5, and $I_b$ is 5 microamps. In that case, the timer interval $t_2$-$t_3$ ranges from 3 nanoseconds to 300 nanoseconds. This added delay cannot be tolerated in an operating system environment.

By comparison, when the via contact 30 is defective and the pullup resistor 23 is present, the voltage $V_1$ on conductor 20 stops dropping before it reaches the reference voltage. This is illustrated by waveform 42. Thus, the output voltages of the logic gates 10-2 thru 10-N never switch; and so the occurrence of a defective via contact 30 is easily detected.

One condition that must be met in order to ensure that the voltage waveform 42 has the above described shape is given by equation 1 in FIG. 3. That equation states that under the condition where transistor 14 is turned off and the via contact 30 is defective, the absolute value of the voltage which the pullup resistor 23 couples to conductor 20 must be closer to a logic one than to a logic zero.

Equation 2 then expressed the voltage which the pullup resistor 23 couples to conductor 20 in terms of the terms $I_b$, N, and $R_{up}$. $I_b$ is the base current that is drawn by an input terminal of a logic gate; N is the maximum number of logic gates that are interconnected by the conductor 20; and $R_{up}$ is the resistance of the pullup resistor 23.

By algebraically solving equation 2 for $R_{up}$, equation 3 is obtained. This equation gives one constraint on the resistance of the pullup resistor 23; and in general, it says to keep the resistance small.

A numerical example of how equation 3 may be met is given by equation 4. In this example, the base current $I_b$ is five microamps, the value of N is eleven, and the reference voltage is 1.3 volts. Putting these numbers into equation 3 yields the constraint that the pullup resistor 23 must be less than 26 kilo-ohms.

Referring now to FIG. 4, a different set of equations are given which impose another constraint on the pullup resistor 23. These equations express the delay which resistor 23 adds to the voltage $V_1$ on conductor 20 under the condition where via contact 30 is operational. For this delay to be small, the value of the pullup resistor must be large.

Considering first equation 1 of FIG. 4, it states that the time $t_c$ that it takes to charge the parasitic capacitance 21 is equal to the voltage across that capacitor times the magnitude of the capacitor divided by the current through it. When pullup resistor 23 is not present, the average current through the parasitic capacitor is expressed by equation 2. By comparison, when the pullup resistor is present, the average current through the parasitic capacitor is expressed by equation 3.

Comparing equation 2 to equation 3, it is evident that their difference is equal to the reference voltage $V_r$ divided by the pullup resistor. That term should be as small as possible in order to minimize the delay which is caused by the shunting effect of the pullup resistor.

Thus equation 4 gives the constraint that, preferably, the pullup resistor 23 is at least four times larger than the pulldown resistor 22.

A numerical example of the above is given in equation 5. In this example, the reference voltage is 1.3 volts, the pulldown resistor 22 is three kilo-ohms, and the pullup resistor 23 is 20 kilo-ohms. With these numbers, as stated by equation 6, the pullup resistor 23 causes the parasitic capacitor 21 to charge only about five percent slower than it would if the pullup were eliminated.

Further, the effect of the pullup resistor 23 is even less than five percent on the total delay from the input terminal of one gate to the input terminal of another gate. That is because the total delay includes the gate delay itself, and the presence of the pullup resistor 23 does not affect the gate delay. Typically, the gate delay is approximately equal to the parasitic capacitance delay $t_c$. So in that case, as stated by equation 7, the presence of the pullup resistor 23 affects the total delay by only about two and one-half percent.

Next, consider FIG. 5. It contains a set of equations which calculate the probability of not being able to detect a defective via contact 30 under the condition where pullup resistor 23 is incorporated into the FIG. 1 circuit. For comparison, the equations also calculate the probability of not being able to detect a defective via contact under the condition where resistor 23 is not incorporated in the FIG. 1 circuit.

To begin, equation 1 states that the probability of any via contact being defective can be represented by the symbol $P_d$. When via contact 30 is defective, it will disconnect the pulldown resistor 22 from conductor 20 and thereby gfive the appearance that the pulldown resistor is missing. Thus, as stated in equation 2, the probability of a missing pulldown resistor 22 on a particular conductor 20 is $P_d$.

Similarly, when via contact 31 is defective, the pullup resistor 23 will be disconnected from conductor 20. In other words, a defective via contact 31 will give the appearance of a missing pullup resistor 23. Thus, as stated by equation 3, the probability of a missing pullup resistor occurring anywhere on a particular conductor also is $P_d$.

Suppose now that $N_g$ is the total number of groups of logic gates on the chip. Then, as stated by equation 5, the probability of an undetectable missing pulldown resistor 23 occurring anywhere on the chip is $(P_d)^2 N_g$.

Equation 6 gives a numerical example of the above probabilities. In this example, the probability of a defective via contact is $10^{-6}$, and the number of groups of logic gates on the chip is $10^3$. Thus, the probability of an undetectable missing pulldown resistor on the chip is $10^{-9}$.

By comparison, without the pullup resistor, the probability of an undetectable missing pulldown resistor is $P_d N_g$ or $10^{-3}$. In other words, with the invention, detectability of a missing pulldown resistor is improved by a factor of one million!

Turning now to FIG. 6A and FIG. 6B, additional details on the structure of the via contacts are shown. In FIG. 6A, reference numeral 30 indicates one via contact, reference numeral 22 indicates a portion of pulldown resistor 22, and reference numeral 20 indicates a portion of the interconnecting conductor. Suitably, resistor 22 is formed by a doped region in a semiconductor substrate; conductor 20 is a patterned metal layer which is separated from resistor 22 by an insulating layer; and via contact 30 is a metal-filled hole through the insulating layer.

In FIG. 6B, two via contacts 30a and 30b connect via conductor 20 to the pulldown resistor 22. Here, the portion of conductor 20 in the X direction is formed by one patterned metal layer, and the portion of conductor 20 in the Y direction is formed by another patterned metal layer. An insulating layer separates the two patterned metal layers from each other. Via contacts 30a and 30b are metal-filled holes which penetrate the insulating layer.

When two via contacts serially connect a resistor to the gates 10-2 thru 10-N, a defect in either contact will produce the effect of a missing pulldown. Thus the probability of a missing resistor increases to $2P_d$. With the present invention, however, that increase is insignificant since the probability of a missing pulldown being undetectable is still in the $10^{-9}$ range. But without the pullup resistor, the probability of a missing pulldown being undetectable would raise to $2P_d N_g$ or about one in five hundred,—which is intolerable.

Defects in the via contacts 30, 30a and 30b can arise from many different causes. For example, a dust particle or other contaminant can plug the contact hole before it is filled with metal. Also, the mask which defines the via holes can have a flaw. Also, the insulating layer in which the via is made often is deposited with a non-uniform thickness and may be too thick in some locations to be penetrated with a timed etch.

A preferred embodiment of the invention has now been described in detail. In addition, however, many changes and modifications can be made to these details without departing from the nature and spirit of the invention.

For example, in FIG. 1, the gates 10-1 thru 10-N need not be all the same. Some of the gates can perform a NOR function, some of the gates can perform a NAND function, some of the gates can perform an AND function, etc.

As another alternative, the pullup resistor 23 need not be a simple resistor but can be any electronic component that has a suitable resistance between its terminals. For example, the resistor 23 can be replaced with a diode, and it can be replaced with a transistor having its base connected to its collector.

As still another alternative, the pullup resistor 23 need not be connected to ground. Instead, it can be connected to any voltage bus which carries a voltage above the reference voltage $V_r$.

Accordingly, since many such modifications can be made to the above details, it is to be understood that the invention is not limited to those details but is defined by the appended claims.

What is claimed is:

1. An integrated circuit having improved testability for defective via contacts, comprising:
   a plurality of N logic gages which are in a semiconductor chip;
   one of said gates having an output terminal which is connected by a conductor in said chip to respective input terminals on the remaining N−1 logic gates;
   said one logic gate having ON and OFF states which respectively couple and decouple at 1 voltage level to said conductor;
   a first resistor means, having a resistance R1, which couples said conductor through a first via contact, in the absence of a defect therein, to a 0 voltage bus;

said remaining N−1 logic gates being constructed such that they each drain a current $I_b$ from said conductor through their respective input terminal; and a second resistor means, having a resistance R2, which couples said conductor through a second via contact, in the absence of a defect therein, to another voltage bus;

said resistance R2 being selected to (a) carry a current of magnitude $I_b(N-1)$ from said another volage bus to said conductor under the condition where said first via is open due to a defect and said one logic gate is OFF, (b) produce a voltage drop when said current of magnitude $I_b(N-1)$ is flowing such that the voltage coupled to said conductor is closer to said 1 voltage than to said 0 voltage, and (c) be substantially larger than said resistance R1.

2. An integrated circuit according to claim 1 wherein said resistance R2 is at least four times said resistance R1.

3. An integrated circuit according to claim 1 wherein said input terminals are connected within said N−1 logic gates, to the base of respective bipolar transistors each of which drain said current $I_b$ from said conductor.

4. An integrated circuit according to claim 1 wherein said first and second via contacts occur in said chip between two patterned metal layers that are separated, except for said via contacts, by an insulating layer.

5. An integrated circuit according to claim 1 wherein said first and second via contacts occur in said chip between a patterned metal layer and a resistive region on a substrate that are separated, except for said via contacts, by an insulating layer.

6. An integrated circuit according to claim 1 wherein in said chip, saod plurality of N logic gates along with their accompanying claim 1 limitations are repeated hundreds of times.

7. An integrated circuit according to claim 1 wherein another voltage bus is coupled on said chip to carry said 1 voltage level.

8. An integrated circuit according to claim 1 wherein said 1 voltage level is ground and said 0 voltage level is negative.

9. An integrated circuit having improved testability for defective via contacts, comprising:

a plurality of N logic gates which are in a semiconductor chip;

one of said gates having an output terminal which is connected by a conductor in said chip to respective input terminals on the remaining N−1 logic gates;

said one logic gate having ON and OFF states which respectively couple and decouple a 1 voltage level to said conductor;

a first resistor means, having a resistance R1, which couples ssaid conductor through a first via contact, in the absence of a defect therein, to a 0 voltage bus;

said remaining N−1 gates being constructed such that they each drain a current $I_b$ from said conductor through their respective input terminal; and a second resistor means having a resistance R2 which couples said conductor through a second via contact, in the absence of a defect therein, to another bus that carries a voltage V; said resistance R2 being selected such that R2 is substantially larger than R1, and, $V - I_b(n-1)R2$ is closer to said 1 voltage level than said 0 voltage level where the term $I_b(N-1)$ is a current which flows through said second resistor means to said conductor.

10. An integrated circuit according to claim 9 wherein said resistance R2 is at least four times said resistance R1.

11. An integrated circuit according to claim 9 wherein said input terminals are connected within said N−1 logic gates to the base of respective bipolar transistors each of which drain said current $I_b$ from said conductor.

* * * * *